(12) United States Patent
Jiang et al.

(10) Patent No.: US 9,489,047 B2
(45) Date of Patent: Nov. 8, 2016

(54) HAPTIC DEVICE WITH LINEAR RESONANT ACTUATOR

(71) Applicant: IMMERSION CORPORATION, San Jose, CA (US)

(72) Inventors: Li Jiang, Union City, CA (US); Juan Manuel Cruz-Hernandez, Montreal (CA)

(73) Assignee: Immersion Corporation, San Jose, CA (US)

( * ) Notice: Subject to any disclaimer, the term of this patent is extended or adjusted under 35 U.S.C. 154(b) by 182 days.

(21) Appl. No.: 13/782,684

(22) Filed: Mar. 1, 2013

(65) Prior Publication Data

US 2014/0247227 A1    Sep. 4, 2014

(51) Int. Cl.
| G06F 3/00 | (2006.01) |
| G06F 3/01 | (2006.01) |
| H01L 41/09 | (2006.01) |

(52) U.S. Cl.
CPC ........... *G06F 3/016* (2013.01); *H01L 41/0926* (2013.01)

(58) Field of Classification Search
USPC ................................................ 345/156, 173
See application file for complete search history.

(56) References Cited

U.S. PATENT DOCUMENTS

| 2006/0119573 A1 | 6/2006 | Grant et al. | |
| 2007/0202841 A1* | 8/2007 | Cruz-Hernandez et al. | . 455/403 |
| 2008/0216001 A1* | 9/2008 | Ording et al. | ................ 715/763 |
| 2010/0231550 A1* | 9/2010 | Cruz-Hernandez et al. | . 345/174 |
| 2011/0115709 A1* | 5/2011 | Cruz-Hernandez | ........... 345/168 |
| 2011/0163985 A1 | 7/2011 | Bae et al. | |

FOREIGN PATENT DOCUMENTS

WO    WO 2006/071449 A1    7/2006

OTHER PUBLICATIONS

Extended European Search Report as issued in European Patent Application No. 14157366.7, dated Jan. 23, 2015.
Rao, S., "High-definition haptics: Feel the difference!" Texas Instruments Incorporated, Analog Applications Journal, High-Performance Analog Products, Retrieved from the Internet: <http://www.ti.com/lit/an/slyt483/slyt483.pdf>. [Retrieved on Dec. 19, 2014]; Dec. 1, 2012, pp. 29-32.
"Haptic Driver for ERM and LRA with Internal Memory and Smart Loop Architecture," Retrieved from the Internet: http://www.ti.com.cn/cn/lit/ds/symlink/drv2604.pdf.> [Retrieved on Dec. 19, 2014]; Dec. 5, 2012, pp. 1-6.

* cited by examiner

*Primary Examiner* — Jonathan Boyd
(74) *Attorney, Agent, or Firm* — Medler Ferro Woodhouse & Mills

(57) ABSTRACT

A haptic output device including an actuator configured to generate a haptic effect, and a processor configured to communicate a driving signal to the actuator and to communicate a braking signal to the actuator before or at the same time the driving signal is terminated to generate the haptic effect. The braking signal has a frequency substantially the same as a resonant frequency of the actuator and at a reverse phase of the driving signal.

12 Claims, 7 Drawing Sheets

HAPTIC DEVICE WITH LINEAR RESONANT ACTUATOR

FIELD

The present invention is related to linear resonant actuators for haptic devices.

BACKGROUND

Electronic device manufacturers strive to produce a rich interface for users. Conventional devices use visual and auditory cues to provide feedback to a user. In some interface devices, kinesthetic feedback (such as active and resistive force feedback) and/or tactile feedback (such as vibration, texture, and heat) is also provided to the user, more generally known collectively as "haptic feedback" or "haptic effects". Haptic feedback can provide cues that enhance and simplify the user interface. Specifically, vibration effects, or vibrotactile haptic effects, may be useful in providing cues to users of electronic devices to alert the user to specific events, or provide realistic feedback to create greater sensory immersion within a simulated or virtual environment.

In order to generate vibration effects, many devices utilize some type of actuator or haptic output device. Known haptic output devices used for this purpose include an electromagnetic actuator such as an Eccentric Rotating Mass ("ERM") in which an eccentric mass is moved by a motor, a Linear Resonant Actuator ("LRA") in which a mass attached to a spring is driven back and forth, or a "smart material" such as piezoelectric, electro-active polymers or shape memory alloys. Haptic output devices also broadly include non-mechanical or non-vibratory devices such as those that use electrostatic friction ("ESF"), ultrasonic surface friction ("USF"), or those that induce acoustic radiation pressure with an ultrasonic haptic transducer, or those that use a haptic substrate and a flexible or deformable surface, or those that provide projected haptic output such as a puff of air using an air jet, and so on.

Development of haptic feedback structures has led to smaller, more compact devices. As display screens having high definition have increased, so has the need for high definition ("HD") haptic feedback. Piezoelectric based linear resonant actuators may be the next generation HD haptic actuators for touch screen surfaces and other applications. Due to its nature of being a resonant actuator, a piezoelectric based linear resonant actuator can create a haptic feedback that is a little "buzzy", which is caused by the low damping ratio of the actuator so that after the actuation signal ends, the piezoelectric linear resonant actuator will continue to vibrate for some time. It is desirable to terminate this vibration residue as fast as possible. Although closed loop control strategies have been used to reduce the "buzzing", closed loop control strategies require sensing and some computational ability in real time, which adds cost to the actuator.

SUMMARY

It is desirable to improve the performance of linear resonant actuators, particularly piezoelectric based linear resonant actuators, without increasing the cost of the system. According to embodiments of the present invention, devices and methods utilizing an open loop braking strategy that does not use an external sensor are provided.

According to an aspect of the present invention, there is provided a haptic output device that includes an actuator configured to generate a haptic effect; and a processor configured to communicate a driving signal to the actuator and to communicate a braking signal to the actuator before or at the same time the driving signal is terminated to generate the haptic effect. The braking signal has a frequency substantially the same as a resonant frequency of the actuator and at a reverse phase of the driving signal.

According to an aspect of the present invention, there is provided a method of producing a haptic effect with a haptic output device comprising a processor and an actuator. The method includes generating a driving signal with the processor, communicating the driving signal to the actuator to drive the actuator, and generating a braking signal with the processor. The braking signal has a frequency substantially the same as the resonant frequency of the actuator and at a reverse phase of the driving signal. The method also includes communicating the braking signal to the actuator to brake the actuator before or at the same time communication of the driving signal is terminated.

According to an aspect of the present invention, there is provided an electronic device that includes a touch screen device configured to receive an input from a user, and a haptic device configured to generate a haptic effect in response to the input from the user. The haptic device includes an actuator, and a processor configured to communicate a driving signal to the actuator and to communicate a braking signal to the actuator before or at the same time the driving signal is terminated to generate the haptic effect. The braking signal has a frequency substantially the same as a resonant frequency of the actuator and at a reverse phase of the driving signal.

BRIEF DESCRIPTION OF THE DRAWINGS

The components of the following Figures are illustrated to emphasize the general principles of the present disclosure and are not necessarily drawn to scale. Reference characters designating corresponding components are repeated as necessary throughout the Figures for the sake of consistency and clarity.

DETAILED DESCRIPTION

The present disclosure describes embodiments of haptic devices that include haptic feedback actuators that impose haptic effects on a user via a user interface, human-computer interface, or other portions of a user device on which or within which the actuators reside. In particular, the embodiments of the haptic devices described herein can be configured to apply haptic effects to a touch sensitive surface of a user device. The touch sensitive surface, in some embodiments, can be part of a display device that may include both a visual output mechanism and a touch sensitive input mechanism. Thus, haptic feedback can be applied in user devices, such as electronic handheld devices, for providing a rich sensory experience for the user.

Although many of the examples described herein relate to touch screen devices, it should be understood that the present disclosure also encompasses other types of human-computer interfaces involving touch sensitive structures. In addition, other features and advantages will be apparent to one of ordinary skill in the art upon reading and understanding the general principles of the present disclosure. These other features and advantages are intended to be included in the present disclosure as well.

Figure 1:
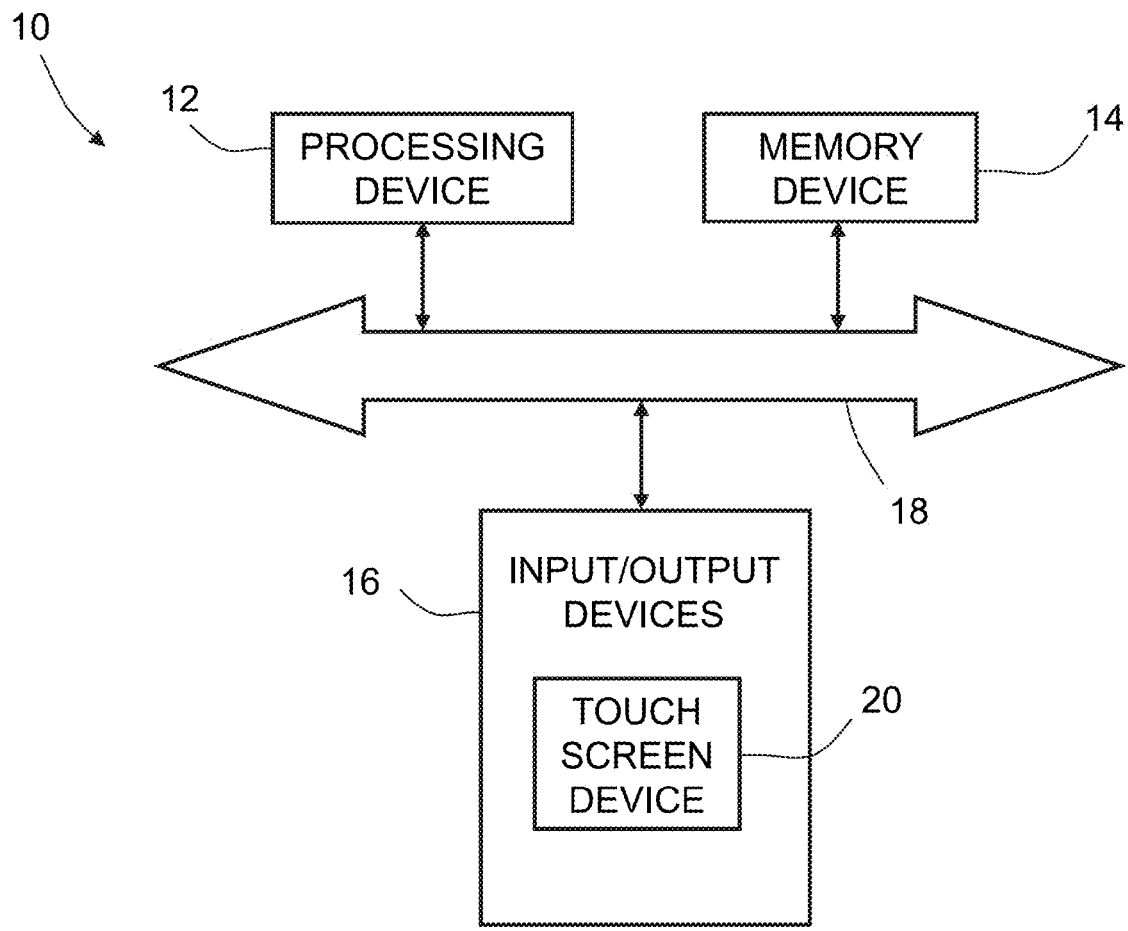
FIG. 1 illustrates a schematic view of an electronic device, according to embodiments of the invention.

FIG. 1 is a block diagram of an electronic device 10 in accordance with an embodiment of the invention. As illustrated, the electronic device 10 includes a processing device (e.g., a processor) 12, a memory device 14, and input/output devices 16, which are interconnected via a bus 18. In an embodiment, the input/output devices 16 may include a touch screen device 20 or other human-computer interface devices.

The touch screen device 20 may be configured as any suitable human-computer interface or touch/contact surface assembly. The touch screen device 20 may be any touch screen, touch pad, touch sensitive structure, computer monitor, laptop display device, workbook display device, kiosk screen, portable electronic device screen, or other suitable touch sensitive device. The touch screen device 20 may be configured for physical interaction with a user-controlled device, such as a stylus, finger, etc. In some embodiments, the touch screen device 20 may include at least one output device and at least one input device. For example, the touch screen device 20 might include a visual display and a touch sensitive screen superimposed thereon to receive inputs from a user's finger. The visual display may include a high definition display screen.

In various embodiments, the touch screen device 20 provides haptic feedback to at least a portion of the electronic device 10, which can be conveyed to a user in contact with the electronic device 10. Particularly, the touch screen device 20 can provide haptic feedback to the touch screen itself to impose a haptic effect when the user in is contact with the screen. The haptic effects can be used to enhance the user experience, and particularly can provide a confirmation to the user that the user has made sufficient contact with the screen to be detected by the touch screen device 20.

The electronic device 10 may be any device, such as a desk top computer, laptop computer, electronic workbook, electronic handheld device (such as a mobile phone, gaming device, personal digital assistant ("PDA"), portable e-mail device, portable Internet access device, calculator, etc.), kiosk (such as an automated teller machine, ticking purchasing machine, etc.), printer, point-of-sale device, game controller, or other electronic device.

The processing device 12 may be a general-purpose or specific-purpose processor or microcontroller for managing or controlling the operations and functions of the electronic device 10. For example, the processing device 12 may be specifically designed as an application-specific integrated circuit ("ASIC") to control output signals to a driver of the input/output devices 16 to provide haptic effects. The processing device 12 may be configured to decide, based on predefined factors, what haptic effects are to be played, the order in which the haptic effects are played, and the magnitude, frequency, duration, and/or other parameters of the haptic effects. The processing device 12 can also be configured to provide streaming motor commands that can be used to drive the haptic actuators for providing a particular haptic effect. In some embodiments, the processing device 12 may actually include a plurality of processors, each configured to perform certain functions within the electronic device 10.

The memory device 14 may include one or more internally fixed storage units, removable storage units, and/or remotely accessible storage units. The various storage units may include any combination of volatile memory and non-volatile memory. The storage units may be configured to store any combination of information, data, instructions, software code, etc. More particularly, the storage devices may include haptic effect profiles, instructions for how the haptic actuation devices of the input/output devices 16 are to be driven, or other information for generating haptic effects.

In addition to the touch screen device 20, the input/output devices 16 may also include specific input mechanisms and output mechanisms. For example, the input mechanisms may include such devices as keyboards, keypads, cursor control devices (e.g., computer mice), or other data entry devices. Output mechanisms may include a computer monitor, virtual reality display device, audio output device, printer, or other peripheral devices. The input/output devices 16 may include mechanisms that are designed to not only receive input from a user and but also provide feedback to the user, such as many examples of touch screen devices. The touch screen device 20 and other input/out devices 16 may include any suitable combination and configuration of buttons, keypads, cursor control devices, touch screen components, stylus-receptive components, or other data entry components. The touch screen device 20 may also include any suitable combination of computer monitors, display screens, touch screen displays, haptic or tactile actuators, haptic effect devices, or other notification devices for providing output to the user.

Figure 2:
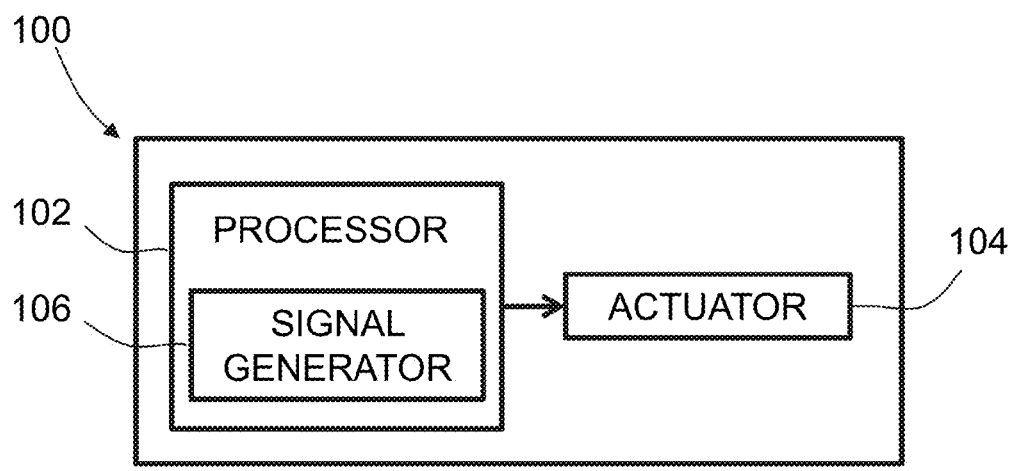
FIG. 2 illustrates a schematic view of a haptic device that may be used in the electronic device of FIG. 1, according to embodiments of the invention.

FIG. 2 illustrates an embodiment of a haptic device 100 that may be used as part of the input/output devices 16 of FIG. 1. As illustrated, the haptic device 100 includes a processor 102 and an actuator 104 in signal communication with the processor 102. The processor 102 includes a signal generator 106 that is configured to generate driving signals and braking signals for communication to the actuator 104, as discussed in further detail below. The actuator 104 may be a resonant actuator, such as a linear resonant actuator.

Non-limiting embodiments of actuators that may be used in the haptic device 100 are discussed in further detail below.

Figure 3:
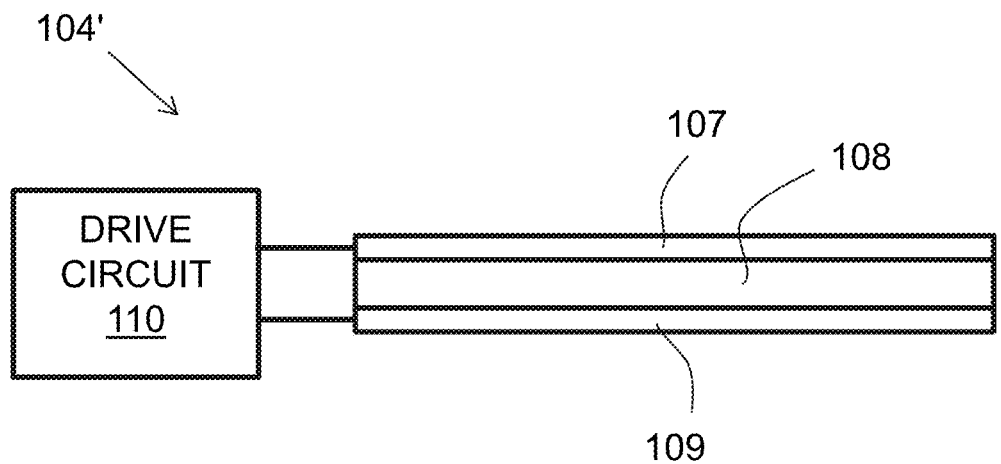
FIG. 3 illustrates a schematic view of an actuator of the haptic device of FIG. 2, according to an embodiment of the invention.

FIG. 3 illustrates an embodiment of the actuator 104 of FIG. 2, represented by 104'. As illustrated, the actuator 104' is a laminated structure that includes a first electrode layer 107, a piezoelectric layer 108, and a second electrode layer 109. The piezoelectric layer may be made from a composite piezoelectric material. The first electrode layer 107 and the second electrode layer 109 may be formed on opposite sides of the piezoelectric layer 108 and may be connected to the signal generator 106 of FIG. 2, which may include an actuator drive circuit 110. The actuator drive circuit 110 is configured to stimulate the piezoelectric layer 108 to cause it to expand or contract, thereby generating a haptic effect that can be sensed by the user. The first electrode layer 107 and the second electrode layer 109 are electrically conductive layers for allowing the signals from the actuator drive circuit 110 to be distributed across the piezoelectric layer 40. In some embodiments, the first and second electrode layers 107, 109 equally distribute the signals across the piezoelectric layer 108.

Figure 4:
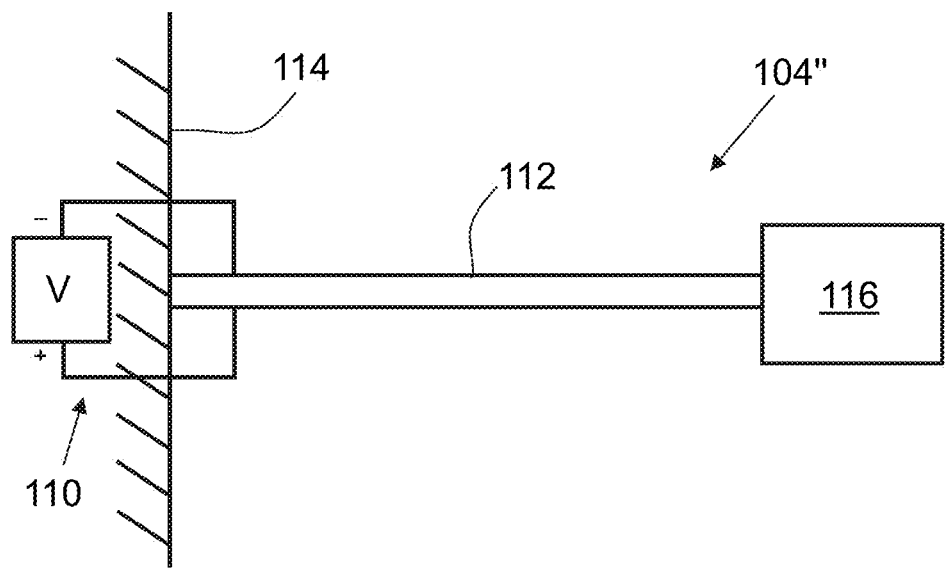
FIG. 4 illustrates a schematic view of an actuator of the haptic device of FIG. 2, according to an embodiment of the invention.
Figure 5:
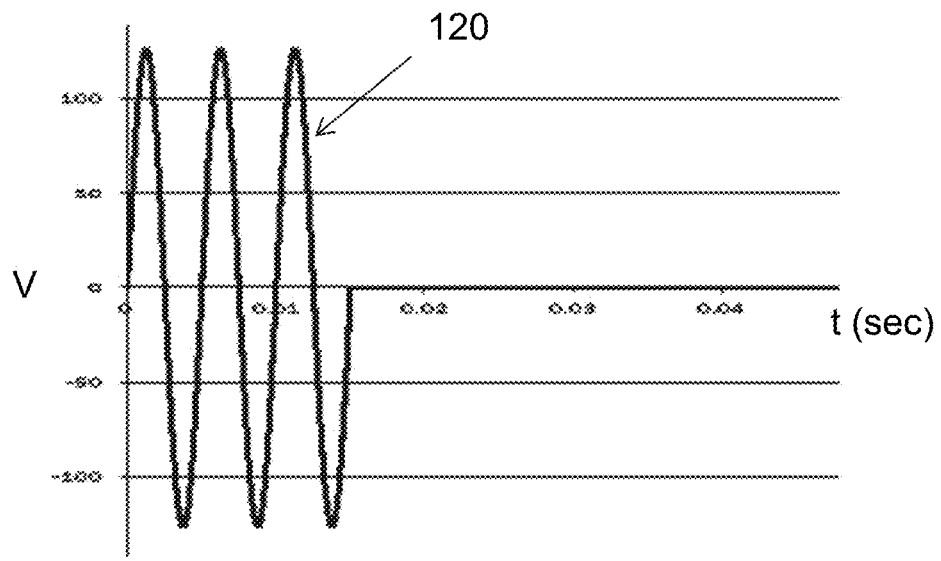
FIG. 5 illustrates a driving signal that may be used to drive the actuator in the haptic device of FIG. 2, according to an embodiment of the invention.

FIG. 4 illustrates an embodiment of the actuator 104 of FIG. 2, represented by 104". As illustrated, the actuator 104" includes a piezoelectric bender 112 that has a thin elongated body that is supported at or near one end by a holder 114 that is configured to hold the piezoelectric bender 112 in a manner that restrains movement of the portion of the piezoelectric bender 112 being held. Piezoelectric benders are known in the art and generally include at least one layer of piezoelectric ceramic material and at least one layer of a metal substrate. A mass 116 is attached to an end of the piezoelectric bender 112 that is opposite the holder 114. The mass 116 may be connected to the piezoelectric bender 112 by any suitable means, such as with an adhesive. As illustrated in FIG. 4, the piezoelectric bender 112 may be connected to the drive circuit 110 that is configured to generate an electrical driving signal based on an input signal from the processor 102. When the electrical driving signal is applied to the piezoelectric bender 112 across two surfaces of the piezoelectric bender 112, the piezoelectric bender 112 will begin to deflect. By varying the amplitude of the signal, such as providing a sinusoidal driving signal 120, as illustrated in FIG. 5, the piezoelectric bender 112 will vibrate.

The frequency and amplitude of the driving signal provided by the drive circuit 110, the natural mechanical resonant frequency of the piezoelectric bender 112, the length of the piezoelectric bender, and the size of the mass 116 will control the frequency and amplitude of the vibration of the piezoelectric bender 112 and haptic effect provided by the haptic device 100. When the proper voltage is applied to the piezoelectric bender 112, the piezoelectric bender 112 will bend from the fixed end, moving the mass 116 back and forth. The motion of the mass 116 provides acceleration to the attached system. Although the driving signal 120 is illustrated in FIG. 5 as being a sinusoidal signal, embodiments of the invention are not so limited. For example, the driving signal 120 may have a shape that is triangular, rectangular, etc., as known in the art. The illustrated embodiments are not intended to be limiting in any way.

Figure 6:
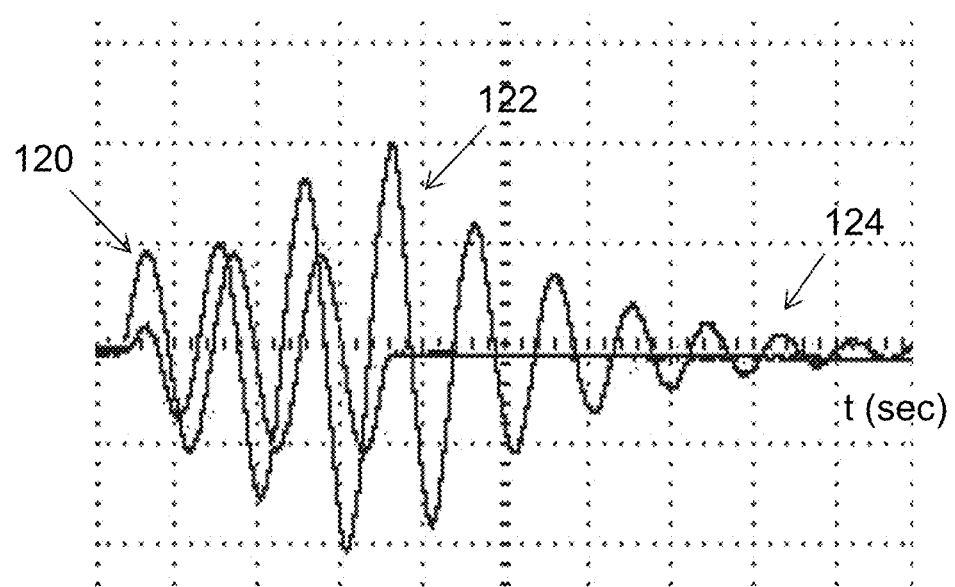
FIG. 6 illustrates the driving signal of FIG. 5 and acceleration of the actuator in the haptic device of FIG. 2 over time in response to the driving signal.

Resonant actuators, such as the piezoelectric linear resonant actuators 104', 104" illustrated in FIGS. 3 and 4, are generally used on portable electronic devices, such as cell phones and tablet computers. When the actuator 104 is actuated, users feel the haptic feedback through the vibrations acceleration on the electronic device 10. FIG. 6 illustrates an example plot of the driving signal 120, which is a sinusoidal voltage signal, and the measured acceleration on the electronic device 10, represented by 122, in response to the driving signal 120. As illustrated, the driving signal 120 is applied for three cycles. As noted above, due to its nature of being a resonant actuator, piezoelectric based linear resonant actuators, such as the embodiments of the actuator 104 described above, may create haptic feedback that is a little "buzzy", which is caused by the low damping ratio of the actuator 104 such that after the driving signal 120 ends, the piezoelectric linear resonant actuator will continue to vibrate for some time, as illustrated in FIG. 6. As illustrated by a tail 124 of the acceleration signal 122 in FIG. 6, the electronic device 10 keeps vibrating, which may be perceived by the user as buzzing or ringing, for more than 40 ms after the driving signal 120 ends. This tail 124 creates a buzzing or ringing feeling on the electronic device 10, which users generally do not prefer.

Figure 7:
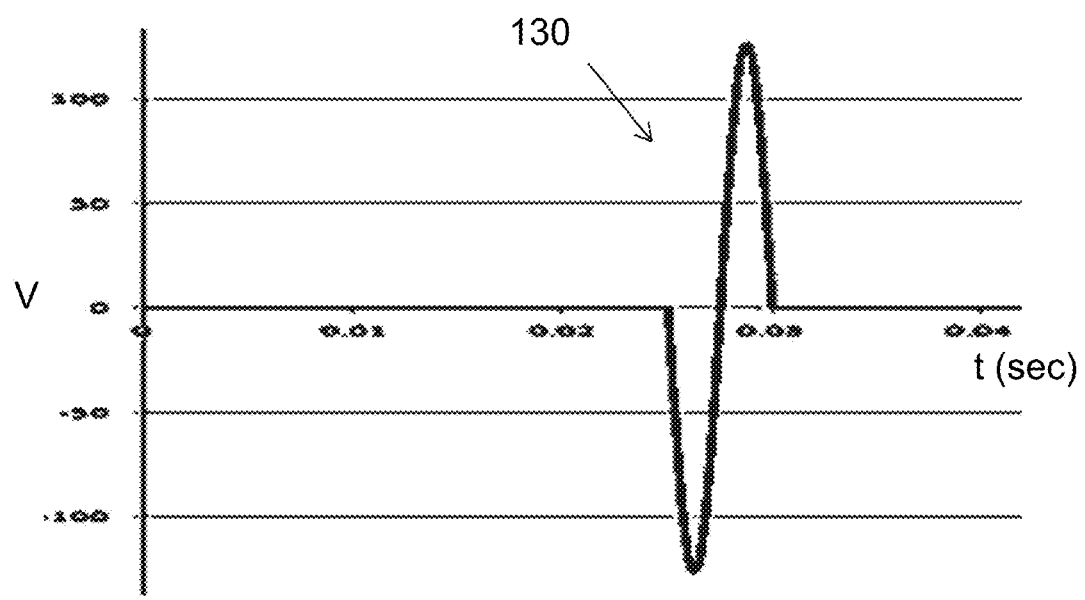
FIG. 7 illustrates a braking signal that may be used to brake the actuator in the haptic device of FIG. 2, according to an embodiment of the invention.

According to embodiments of the invention, a braking signal 130, as illustrated in FIG. 7, that is out of phase at or around the resonant frequency of the actuator 104 is used to stop the actuator 104 from resonating after the driving signal 120 has been terminated. The braking signal can be any predesigned signal, with one or more sinusoidal cycles, continuous or non-continuous, triangular signals or rectangular signals, etc., as known in the art. The illustrated embodiments are not intended to be limiting in any way. In embodiments of the present invention, the braking signal 130 may be about the same as the resonant frequency of the actuator 104, but having a reversed phase. The phase shift is not necessarily 180°, i.e. reversed phase, but may be some other value, depending on the frequency of the driving signal 120 of the actuator 104 (e.g. 100 Hz, 150 Hz, 200 Hz), which is not always at resonant (e.g. resonant at 200 Hz).

It has been shown experimentally that the frequency of the braking pulse 130 is not very sensitive to the resonant frequency of the actuator 104 to achieve a good braking result. For example, in some embodiments, the frequency of the braking signal 130 may be off by some percentage value (~10%) and still create an acceptable braking result. According to embodiments of the invention, a one cycle or one-half cycle sinusoidal braking signal 130 at the actuator's resonant frequency is used to brake the actuator. The braking signal 130 should be applied at the correct moment in time, because if the braking signal is applied at the wrong moment in time, the braking signal may actually excite the system more, instead of providing braking for the system.

According to an embodiment of the invention, the timing of the application of the braking signal 130 relative to the termination of the driving signal 120 may be calculated from a mathematical model of the electronic device 10 and actuator 104. When the driving signal 120 is generated, the system is in a forced vibration mode. Once the driving signal 120 is terminated or ends, the vibration frequency of the system will change to the system's resonant frequency. It has been determined that in order to brake the actuator 104, a sinusoidal braking signal 130 at the resonant frequency of the system and in the opposite phase of the acceleration, which is at the resonant frequency of the system, may be generated and communicated to the actuator 104 so the "buzzing" will be reduced. Although the braking signal 130 may be multiple cycles of a sinusoidal signal, it has been found that one cycle is generally enough to achieve good braking effects.

In an embodiment, the timing of the application of the braking signal 130 may be determined experimentally. For example, through experiments it has been found that one cycle of a sinusoidal signal at resonant frequency is enough to achieve good braking results. In addition to the braking signal frequency and number of cycles, the starting point of the braking signal 130 and the amplitude of the braking signal 130 may be determined experimentally. It has been found that the optimal starting point and the amplitude of the braking signal 130 typically depend on the frequency of the driving signal 120.

Figure 8:
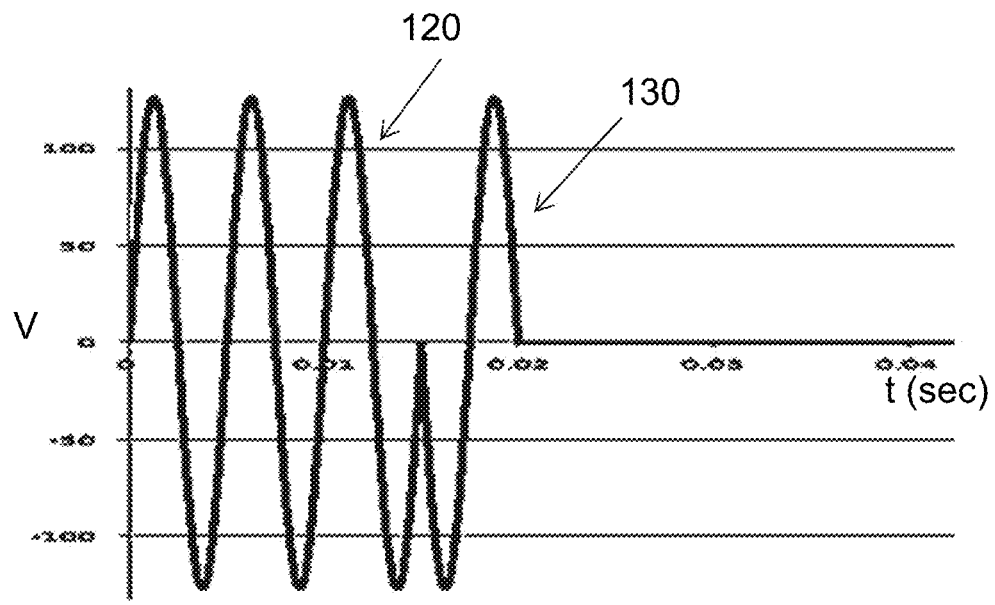
FIG. 8 illustrates the driving signal of FIG. 5 in combination with the braking signal of FIG. 7, with the braking signal beginning at the same time the driving signal is terminated, according to an embodiment of the invention.

The resonant frequency for most piezoelectric linear resonant actuators is from about 150 Hz to about 250 Hz. Using a resonant frequency of 200 Hz as an example, the braking signal 130 may include 1 cycle of a 200 Hz signal, with the sinusoidal signal being the reverse phase of the driving signal 120, as shown in FIG. 8. If the driving signal 120 is at resonant frequency (i.e. 200 Hz in this example), then for a first test, the braking signal 130 should be applied right after the driving signal 120 is terminated, as shown in FIG. 8. In subsequent tests, the starting point of the braking signal 130 may be gradually moved forward and backward on the timeline to find the optimal time at which to communicate the braking signal 130 to the actuator 104. It has been found through such experiments that the braking signal 130 should overlap with the driving signal 120 to achieve the best result in many systems. This means the braking signal 130 should be applied before the driving signal 120 ends, i.e. is terminated.

Figure 9:
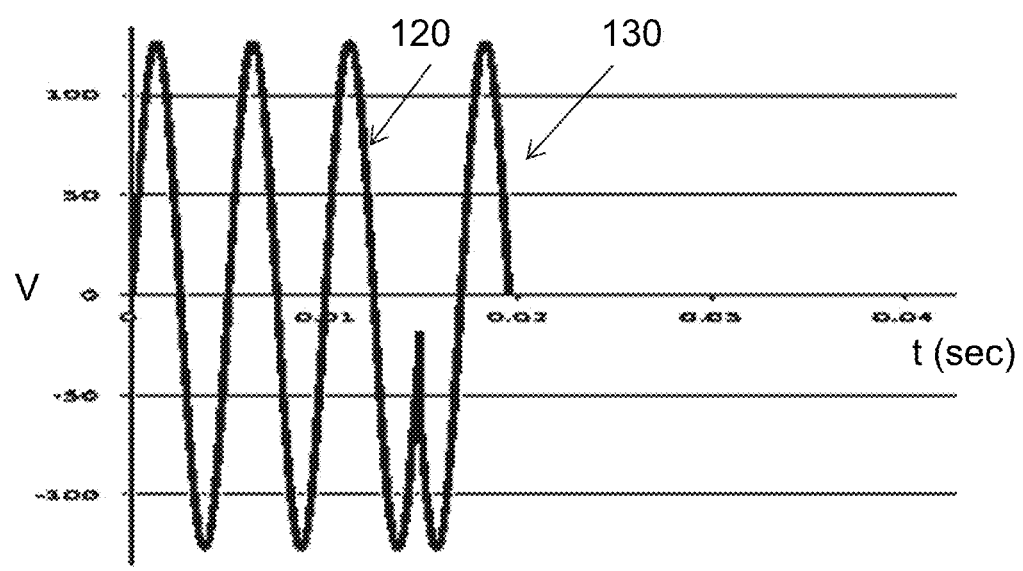
FIG. 9 illustrates the driving signal of FIG. 5 in combination with the braking signal of FIG. 7, with the braking signal beginning before the driving signal is terminated.

If the frequency of the driving signal 120 is lower than the resonant frequency, it has been found experimentally that the starting point of the braking signal 130 should be further into the driving signal 120, as illustrated in FIG. 9, to achieve optimal results. In general, it has been found that the lower the frequency of the driving signal 120, greater overlap between the driving signal 120 and the braking signal 130 is needed to achieve optimal results. Similarly, it has been found that the higher the frequency of the driving signal 120, less overlap is needed between the driving signal 120 and the braking signal 130. When the frequency of the driving signal 120 is higher than a certain frequency, which is typically around the resonant frequency, it is optimal to have no overlap between the driving signal 120 and the braking signal 130.

As for the amplitude of the braking signal 130, it is desirable to have the highest amplitude at or around the resonant frequency. As the frequency of the driving signal is increased or decreased, the optimal amplitude of braking signal decreases.

After conducting a series of experiments on the same system, a data table may be created that includes optimal braking parameters for driving signals 120 that are at different frequencies. In an embodiment, the data table may be stored in the processor 102 as a look-up table. Both the optimal starting time of the braking signal 130 and the optimal braking amplitude depend on the damping coefficient of the piezoelectric linear resonant actuator. Combining the data table and the damping coefficient, a formula based on the experimental data may be generated, which can provide the optimal open loop braking strategy. In an embodiment, the formula may be stored in the processor 102. It has been found experimentally that if the target resonant frequency and the braking frequency is 200 Hz and the actual resonance of the system is within the range of 220 Hz and 190 Hz, good braking results may be achieved.

Figure 10:
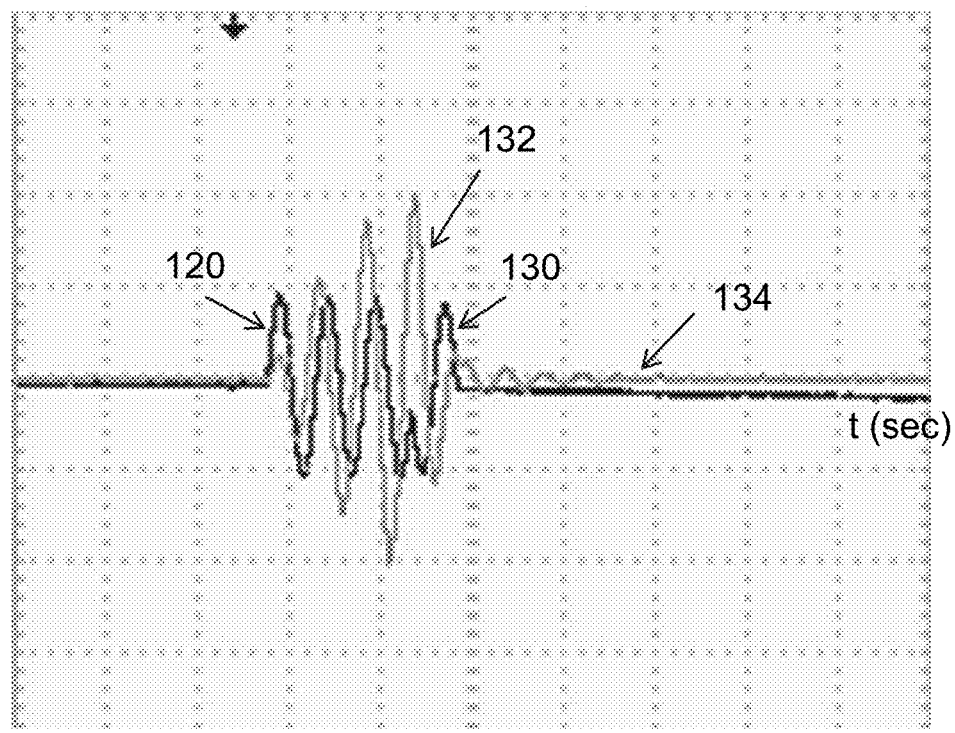
FIG. 10 illustrates the driving signal and braking signal of FIG. 9, and the acceleration of the actuator in the haptic device of FIG. 2 over time in response to the driving signal and braking signal.
Figure 11:
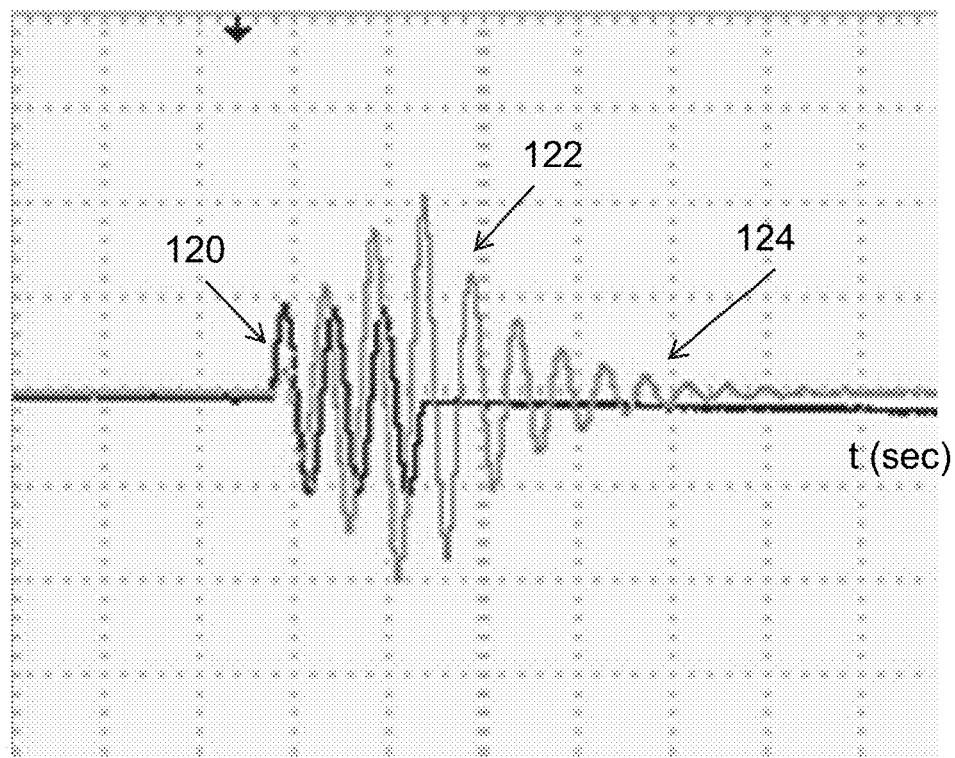
FIG. 11 illustrates the acceleration of the actuator in the haptic device of FIG. 2 over time in response to the same driving signal of FIG. 9, but without the braking signal of FIG. 9.

FIGS. 10 and 11 illustrate the difference in acceleration with open loop braking in accordance with embodiments of the invention (FIG. 10) and without braking (FIG. 11), when using the same driving signal 120. As illustrated, the acceleration curve 132 of FIG. 10 is dampened much more quickly than the acceleration curve 122 of FIG. 11, as evidenced by the amplitudes of the cycles of the tail 134 illustrated in FIG. 10 versus the tail 124 illustrated in FIG. 11. Such dampening results in less "buzzing" or "ringing" to be felt by the user of the electronic device.

Figure 12:
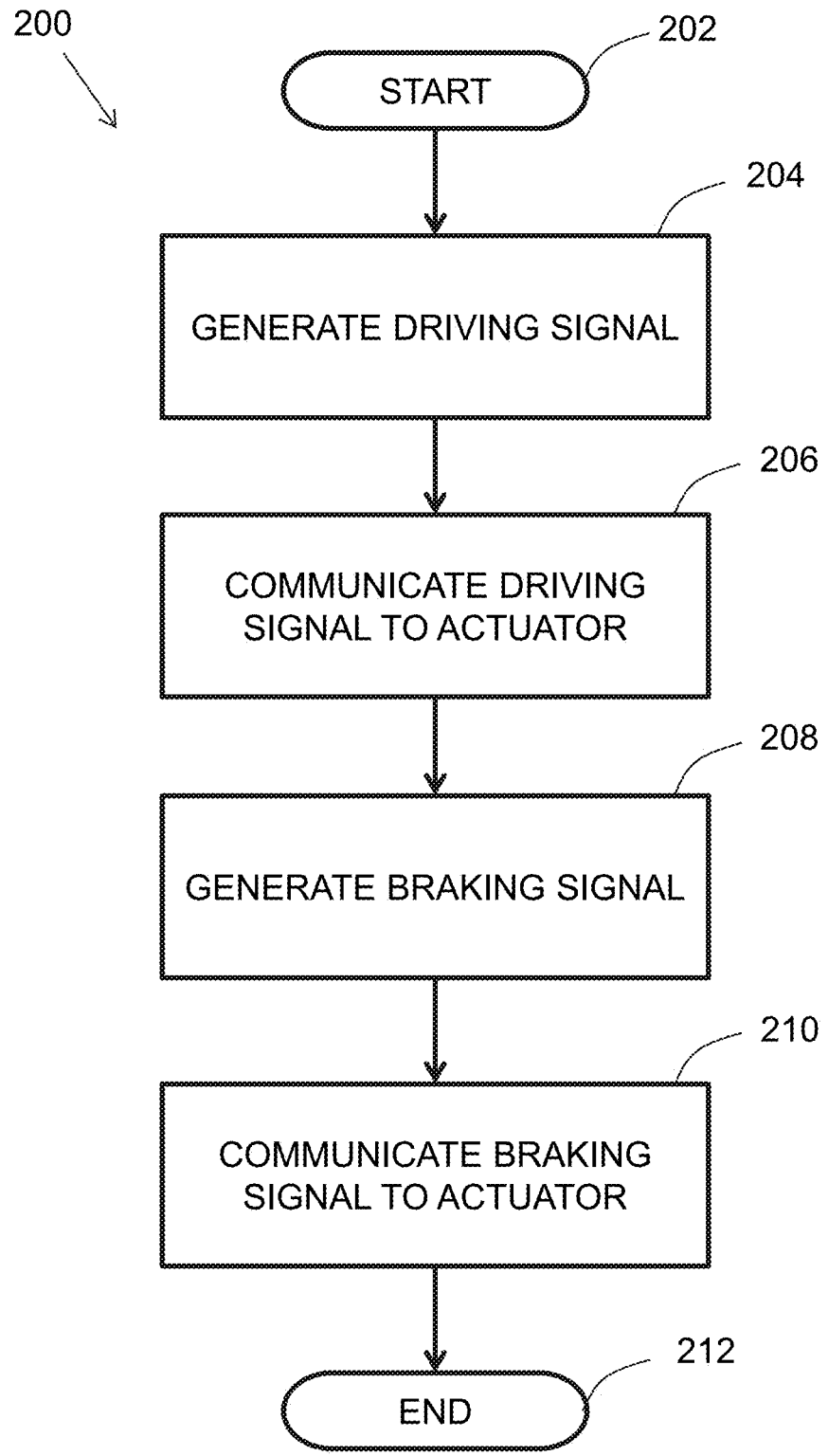
FIG. 12 illustrates a method for generating a haptic effect in accordance with embodiments of the inventions.

FIG. 12 illustrates a method 200 of producing a haptic effect with the haptic device 100 described above, according to an embodiment of the invention. As illustrated, the method 200 starts at 202. At 204, a driving signal for an actuator is generated by a processor. In an embodiment, the driving signal may be the driving signal 120 described above, the actuator may be any of the actuators 104, 104', 104" described above, and the processor may be the processor 102 described above. In an embodiment, the driving signal may be generated by a signal generator, such as the signal generator 106 of the processor 102 described above. At 206, the driving signal is communicated to the actuator to drive the actuator. At 208, a braking signal for the actuator is generated by the processor/signal generator. The braking signal may be the braking signal 130 described above and may have a frequency substantially the same as a resonant frequency of the actuator and at a reverse phase of the driving signal. At 210, the braking signal is communicated to the actuator before or at the same time the driving signal is terminated to generate the haptic effect. The method 200 ends at 212.

Aspects of embodiments of the present invention may be used in other resonant actuators, and not just for the embodiments of resonant actuators of the haptic devices disclosed herein having piezoelectric materials. In addition, aspects of embodiments of the present invention may provide an improved level of compatibility and performance, as compared to haptic devices known in the art, which may be suitable for high definition devices.

Embodiments of the present invention may be used as the actuation unit to enable haptic feedback in various electronic devices, such as touch screen handheld devices (mobile devices, PDA, and navigation systems), automotive applications, gaming consoles, etc.

The embodiments described herein represent a number of possible implementations and examples and are not intended to necessarily limit the present disclosure to any specific embodiments. Instead, various modifications can be made to these embodiments as would be understood by one of ordinary skill in the art. Any such modifications are intended to be included within the spirit and scope of the present disclosure and protected by the following claims.

What is claimed is:

1. A haptic output device, comprising:
   an actuator configured to generate a haptic effect; and
   a processor configured for open loop braking based on a frequency of a driving signal, the processor being configured to communicate the driving signal to the actuator and to communicate the braking signal to the actuator before or at the same time the driving signal is terminated to generate the haptic effect, the braking signal having a frequency substantially the same as a resonant frequency of the actuator and at a reverse phase of the driving signal,
   wherein the processor comprises a lookup table comprising optimal braking parameters for different driving signals at different frequencies, wherein the optimal braking parameters comprise an optimal starting time of the braking signal and an optimal amplitude of the braking signal.

2. The haptic output device according to claim 1, wherein the actuator is a linear resonant actuator.

3. The haptic output device according to claim 2, wherein the actuator is a piezoelectric linear resonant actuator.

4. The haptic output device according to claim 3, wherein the actuator comprises a piezoelectric bender.

5. The haptic output device according to claim 1, wherein the processor comprises a signal generator configured to generate the driving signal and the braking signal.

6. A method of producing a haptic effect with a haptic output device comprising a processor and an actuator, the method comprising:
   determining optimal braking parameters for different driving signals at different frequencies and storing the optimal braking parameters in a lookup table in a processor;
   generating a driving signal with the processor, wherein the processor is configured for open loop braking based on a frequency of the driving signal;
   communicating the driving signal to the actuator to drive the actuator;
   generating a braking signal with the processor, the braking signal having a frequency substantially the same as the resonant frequency of the actuator and at a reverse phase of the driving signal, and the optimal braking parameters for the driving signal, wherein the optimal braking parameters comprise an optimal starting time of the braking signal and an optimal amplitude of the braking signal; and
   communicating the braking signal to the actuator to brake the actuator before or at the same time communication of the driving signal is terminated,
   wherein if the driving signal has a frequency less than the resonant frequency of the actuator, the braking signal is communicated before said communicating the driving signal is terminated.

7. The method according to claim 6, wherein if the driving signal has a frequency equal to the resonant frequency of the actuator, the braking signal is communicated at substantially the same time said communicating the driving signal is terminated.

8. An electronic device, comprising:
   a touch screen device configured to receive an input from a user; and
   a haptic device configured to generate a haptic effect in response to the input from the user, the haptic device comprising
   an actuator, and
   a processor configured for open loop braking based on a frequency of a driving signal, the processor being configured to communicate the driving signal to the actuator and to communicate the braking signal to the actuator before or at the same time the driving signal is terminated to generate the haptic effect, the braking signal having a frequency substantially the same as a resonant frequency of the actuator and at a reverse phase of the driving signal, wherein the processor comprises a lookup table comprising optimal braking parameters for different driving signals at different frequencies, and wherein the optimal braking parameters comprise an optimal starting time of the braking signal and an optimal amplitude of the braking signal.

9. The electronic device according to claim 8, wherein the actuator is a linear resonant actuator.

10. The electronic device according to claim 9, wherein the actuator is a piezoelectric linear resonant actuator.

11. The electronic device according to claim 10, wherein the actuator comprises a piezoelectric bender.

12. The electronic device according to claim 8, wherein the processor comprises a signal generator configured to generate the driving signal and the braking signal.

* * * * *

UNITED STATES PATENT AND TRADEMARK OFFICE
CERTIFICATE OF CORRECTION

PATENT NO. : 9,489,047 B2
APPLICATION NO. : 13/782684
DATED : November 8, 2016
INVENTOR(S) : Li Jiang and Juan Manuel Cruz-Hernandez Page 1 of 1

It is certified that error appears in the above-identified patent and that said Letters Patent is hereby corrected as shown below:

In the Claims

Column 9, Line 20 Claim 6: "actuator and at" should be replaced with --actuator, at--.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*